(12) United States Patent
Hung (10) Patent No.: US 9,967,968 B2
(45) Date of Patent: May 8, 2018

(54) 3D EMI SUPPRESSION STRUCTURE AND ELECTRONIC DEVICE HAVING THE SAME

(71) Applicant: SK hynix Inc., Gyeonggi-do (KR)

(72) Inventor: Kuo Ying Hung, Hsinchu County (TW)

(73) Assignee: SK Hynix Inc., Gyeonggi-do (KR)

( * ) Notice: Subject to any disclaimer, the term of this patent is extended or adjusted under 35 U.S.C. 154(b) by 0 days. days.

(21) Appl. No.: 15/213,305

(22) Filed: Jul. 18, 2016

(65) Prior Publication Data

US 2017/0064815 A1   Mar. 2, 2017

(30) Foreign Application Priority Data

Aug. 28, 2015 (CN) .......................... 2015 1 0543646
Aug. 28, 2015 (TW) ............................. 104128267 A (51) Int. Cl.
| | |
|---|---|
| *H04B 3/28* | (2006.01) |
| *H05K 1/02* | (2006.01) |
| *H01P 3/02* | (2006.01) |
| *H05K 1/11* | (2006.01) |
| *H01P 5/02* | (2006.01) |

(52) U.S. Cl.
CPC ........... *H05K 1/0219* (2013.01); *H01P 3/026* (2013.01); *H01P 5/028* (2013.01); *H05K 1/0298* (2013.01); *H05K 1/115* (2013.01); *H05K 2201/0929* (2013.01)

(58) Field of Classification Search
CPC .... H05K 1/2019; H05K 1/0298; H05K 1/115; H05K 2201/0929; H05K 1/181; H05K 1/0284; H05K 9/0081; H05K 1/0227; H05K 1/0245; H01P 3/026; H01P 5/028; H01P 1/20; H01P 1/2039
See application file for complete search history.

(56) References Cited

U.S. PATENT DOCUMENTS 8,552,811 B2 * 10/2013 Wu .................. H01P 1/2039
                                                    333/12
9,668,390 B2 *  5/2017 Hung .................. H05K 9/0081

* cited by examiner

*Primary Examiner* — Robert J Pascal
*Assistant Examiner* — Kimberly Glenn
(74) *Attorney, Agent, or Firm* — IP & T Group LLP (57) ABSTRACT

A 3D Electromagnetic Interference (EMI) suppression structure and an electronic device having the same, wherein a coplanar waveguide structure, an isolation layer, and a resonance layer may be installed. Furthermore, under the coplanar waveguide structure, the 3D EMI structure may be installed to connect to a conductor part of the resonance layer through a conductive connection part of the isolation layer, thereby further improving the EMI suppression effect and producing an excellent EMI suppression effect.

10 Claims, 13 Drawing Sheets

3D EMI SUPPRESSION STRUCTURE AND ELECTRONIC DEVICE HAVING THE SAME

CROSS-REFERENCES TO RELATED APPLICATION

The present application claims priority under 35 U.S.C. § 119(a) to Chinese application number 201510543646.9, filed on Aug. 28, 2015, and Taiwanese application number 104128267, filed on Aug. 28, 2015, which are herein incorporated by reference in their entirety.

BACKGROUND

1. Technical Field

Various embodiments relate to a structure for reducing electromagnetic interference (EMI) and an electronic device using the same, and more particularly, to a 3D EMI suppression structure using a coplanar waveguide (CPW) and an electronic device having the same.

2. Related Art

As various electronic devices and instruments which operate an electronic system, such as computer devices, computer mainframes hand-held electronic devices, and mobile communication devices have spread and developed electronic operating systems inevitably receive EMI from outside sources or have internal EMI. The EMI source may be caused by another external electronic device or caused by an internal circuit of the electronic device. The EMI is divided into radiated EMI and conducted EMI. Since the radiated EMI is directly transmitted through an open space, the radiated EMI does not need to pass through a transmission medium. Thus the radiated EMI may be removed through a general method such as shielding or grounding. However, the conducted EMI transmits noise through a power or signal line. Thus, an internal line of the electronic device and an external line connected to the electronic device may cause conducted EMI for the signal line in the electronic device. Therefore, mutual interference may occur.

EMI is an unavoidable problem for electronic circuits which are designed to have high-speed digital lines. Particularly, common mode noise and differential signals for transmitting data at high speed during a signal transmission process may cause a serious problem. That is, EMI caused by the common mode noise may have an influence on a wireless communication system of an electronic device or instrument.

Figure 1:
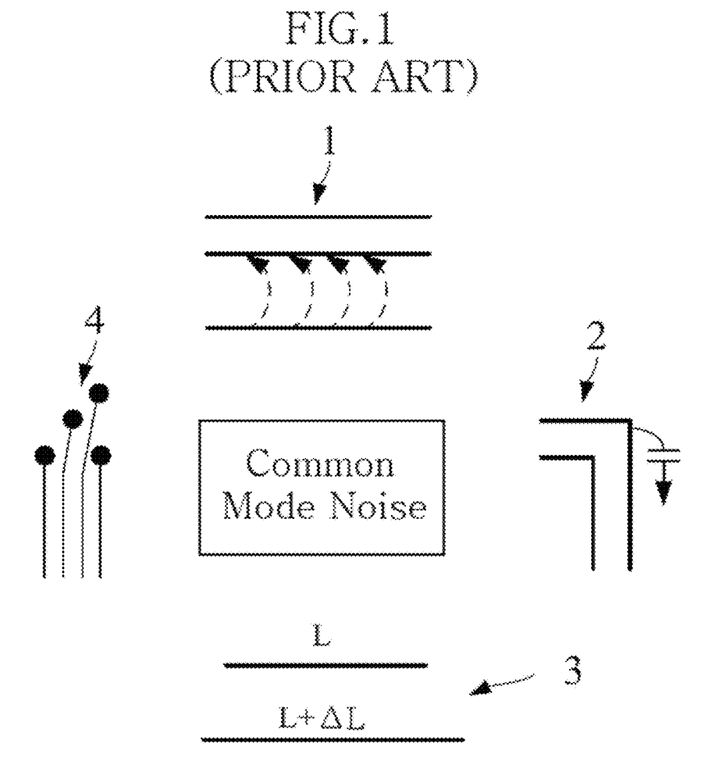
FIG. 1 is a diagram for describing the interference of common mode noise of an electronic device by an external connection device.

For example, FIG. 1 is a diagram for describing the interference of common mode noise in internal lines of an electronic device. FIG. 1 illustrates various interferences such as crosstalk 1, bending 2 length mismatch 3, and layout requirement 4. All of the interferences may have an influence on a wireless transmission system, and make it difficult for a wireless communication module to transmit/receive a wireless signal. Thus, the interferences need to be suppressed.

Conventionally, to suppress common mode noise a common mode choke has been installed in a circuit. However, a magnetic core having high magnetic permeability does not effectively maintain its high magnetic permeability at a high-frequency period, and thus it may lose magnetic permeability. Therefore, the common mode choke cannot be effectively applied to a structure for suppressing common mode noise during high-speed data transmission.

SUMMARY

In an embodiment, there is provided a 3D EMI (Electromagnetic Interference) suppression structure which is installed in a multilayer substrate and stacked in the vertical axis direction of one or more differential pairs of signal transmission lines installed at a first layer of the multilayer substrate. The 3D EMI suppression structure may include: a coplanar waveguide structure installed at a second layer of the multilayer substrate and including a conducting wire band, two ground parts positioned at both sides of the conducting wire band and isolated from the conducting wire band by a distance corresponding to a first isolation groove, and a coupling groove positioned in each of the ground parts and connected to the first isolation groove adjacent thereto through an extended groove; an isolation layer installed at a third layer of the multilayer substrate and having a conductive connection part connected to the conducting wire band through the isolation layer; and a resonance layer installed at a fourth layer of the multilayer substrate and including a conductor part and two ground conductor parts which are positioned at both sides of the conductor part and isolated from the conductor part by a distance corresponding to a second isolation groove, the conductor part being connected to the conductive connection part of the isolation layer.

In another embodiment, the two coupling grooves installed at the second layer of the multilayer substrate may be symmetrical with respect to the conducting wire band.

In another embodiment, the coupling groove may have a rectangular shape, a polygonal shape, or an S-shape in the in-plane direction of the coplanar waveguide structure.

In another embodiment, the extension direction of the conducting wire band and the conductor part may be parallel to a flow direction of the one or more differential pairs of signal transmission lines, the first isolation groove, may be extended to both ends of the conducting wire band so as to surround the conducting wire band, and the second isolation groove may be extended to both ends of the conductor part so as to surround the conductor part.

In another embodiment, the width of the conducting wire band may be larger than the total width occupied by a differential pair of signal transmission lines adjacent to each other at the first layer of the multilayer structure.

In another embodiment, the width of the conductor part may be larger than the width of the conducting wire band.

In another embodiment, the perimeter of the coupling groove may correspond to a common mode signal which is to be suppressed, and the common mode signal may be passed through the one or more differential pairs of signal transmission lines, and have a specific frequency range.

In another embodiment, an electronic device having a 3D EMI suppression structure may include: a multilayer substrate; two signal contacts installed at a first layer of the multilayer substrate; a differential pair of signal transmission lines installed at the first layer of the multilayer substrate, and including first and second signal lines connected between the signal contacts as a transmission path between the two signal contacts; and a 3D EMI suppression structure installed in the multilayer substrate under the differential pair of transmission lines.

In another embodiment, the conducting wire band may have a resistance of 50 ohms.

DETAILED DESCRIPTION

Hereinafter, a 3D EMI suppression structure and an electronic device including the same according to the present disclosure will be described below with reference to the accompanying drawings through exemplary embodiments. Various embodiments are directed to a structure for reducing the occurrence of common mode noise during a signal transmission process.

When each stacked structure is described in an embodiment, the stacked structure may indicate a single layer or a composite structure of layers. For example, when a first layer and a second layer stacked under the first layer are described, the first layer may have a single-layer or multilayer structure, and the second layer may also have a single-layer or multilayer structure. Furthermore, the terms such as first layer, second layer, third layer, and fourth layer represent the sequence of the layers. However, another stacked structure may be interposed between two layers. As described above, a single layer may include a stacked structure.

Figure 2:
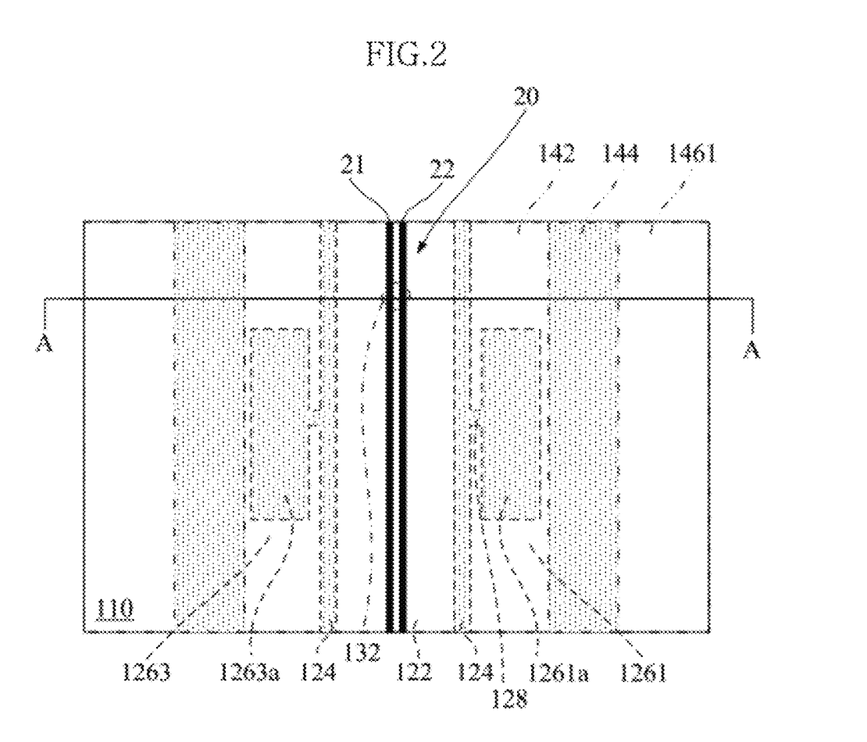
FIG. 2 is a plane view of a 3D EMI suppression structure according to an embodiment.
Figure 3:
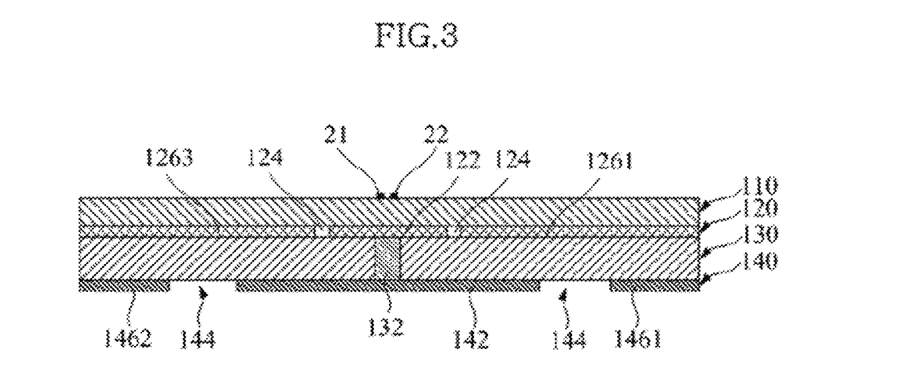
FIG. 3 is a cross-sectional view taken along line A-A of FIG. 2.

FIG. 2 is a plan e view of a 3D EMI suppression structure according to an embodiment, and FIG. 3 is a cross-sectional view taken along line A-A of FIG. 2. In FIG. 2, a plurality of special structures positioned in a multilayer substrate are indicated by different dotted lines.

As illustrated in FIGS. 2 and 3, one or more differential pairs of signal transmission lines 21 and 22 are stacked over a first layer 110 of the multilayer substrate, and the 3D EMI suppression structure according to the embodiment is installed in the vertical axis direction of the one or more differential pairs of signal transmission lines 21 and 22 with respect to the first layer 110 of the multilayer structure. The 3D EMI suppression structure includes a coplanar waveguide structure 120, an isolation layer 130, and a resonance layer 140.

The coplanar waveguide structure 120 is installed at a second layer of the multilayer substrate. The coplanar waveguide structure 120 includes a conducting wire band 122, ground parts 1261 and 1263, and coupling grooves 1261a and 1263a. The two ground parts 1261 and 1263 are positioned at both sides of the conducting wire band 122, respectively, and isolated from the conducting wire band 122 by a distance corresponding to a first isolation groove 24. The two coupling grooves 1261a and 1263a are positioned in the ground parts 1261 and 1263, respectively. Each of the coupling grooves 1261a and 1263a is connected to the first isolation groove 124 adjacent thereto through an extended groove 128. In an embodiment the coupling groove may include a concave groove.

The isolation layer 130 is installed at a third layer of the multilayer substrate. The isolation layer 130 includes a conductive connection part 132 connected to the conducting wire band 122 through the isolation layer 130.

The resonance layer 140 is installed at a fourth layer of the multilayer substrate. The resonance layer 140 includes a conductor part 142 and two ground conductor parts 1461 and 1462 which are positioned at both sides of the conductor part 142 and isolated from the conductor part 142 by a distance corresponding to a second isolation groove 144. The conductor part 142 is connected to the conductive connection part 132 of the isolation layer 130.

The first layer 110 and the isolation layer 130 of the multilayer substrate are dielectric layers formed of a nonconductive material. The coplanar waveguide structure 120, the conductive connection part 132, and the resonance layer 140 are formed of a metal-containing conductive material, for example, titanium nitride, tantalum nitride, nickel silicide, cobalt silicide, silver, aluminum, copper, titanium, tantalum, tantalum carbide (TaC), tantalum silicon nitride (TaSiN), tantalum carbonitride (TaCN), titanium aluminum (TiAl), titanium aluminum nitride (TiAlN), metal alloy, another suitable material, or a combination thereof. The differential pair of signal transmission lines 21 and 22 may include the same material as or a different material from the coplanar waveguide structure 120, the conductive connection part 132, and the resonance layer 140.

As illustrated in FIGS. 2 and 3, the two coupling grooves 1261a and 1263a installed at the second layer of the multilayer substrate are symmetrical with respect to the conducting wire band 122. Furthermore, the two coupling grooves 1261a and 1263a may be formed in a rectangular shape, a polygonal shape, or an S-shape in the in-plane direction of the coplanar waveguide structure 120. When the two coupling grooves 1261a and 1263a are formed in a non-rectangular shape, the coupling grooves 1261a and 1263a may be mapped symmetrically with respect to the conducting wire band 122.

FIGS. 4A to 4D are plane views of the first to fourth layers of the multilayer substrate in FIG. 2, respectively. The plane views clearly illustrate the respective stacked structures. In FIGS. 4A to 4D, the groove structures are illustrated in such a manner that the groove structures seem to be penetrated (blank parts). However, the groove structure based on the etching degree or other elements of a semiconductor process may not be completely penetrated.

Figure 4A:
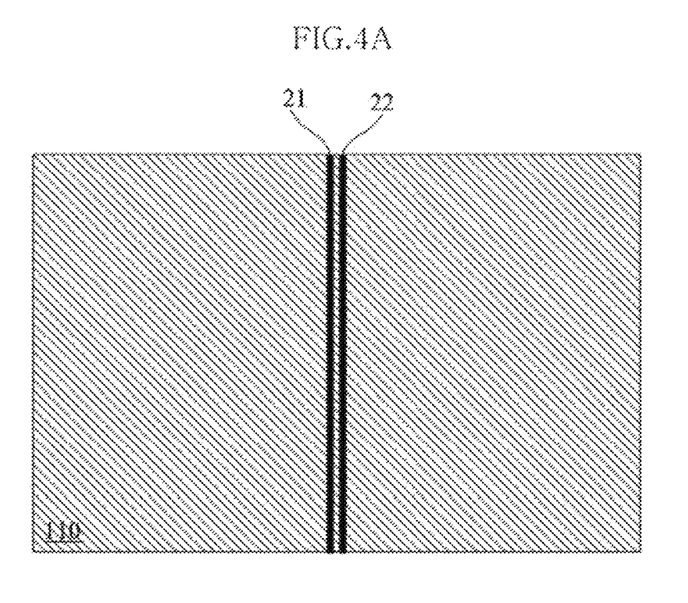
FIG. 4A is a plane view of a first layer of a multilayer substrate in FIG. 2.
Figure 4B:
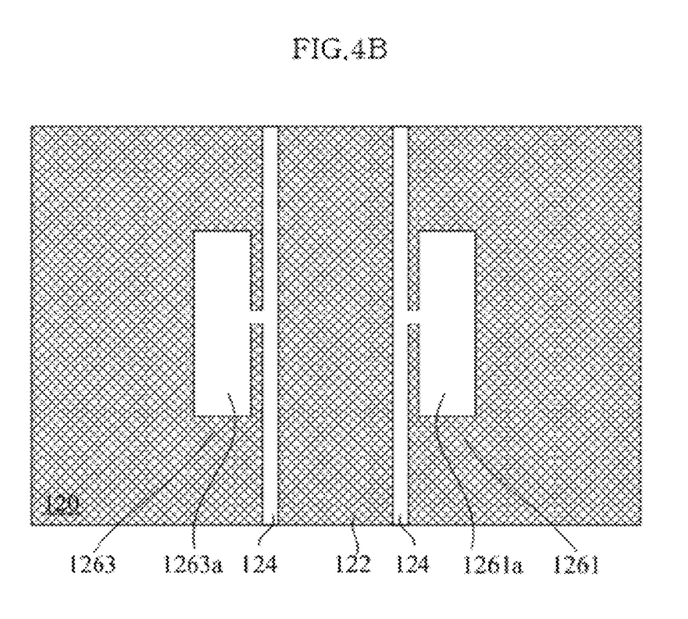
FIG. 4B is a plane view of a second layer of the multilayer substrate in FIG. 2.

In FIG. 4B, the plane pattern of the two coupling grooves 1261a and 1263a may be changed, if necessary. In various embodiments the geometrical shape may be controlled to obtain different EMI suppression effects. The effects may be determined according to a common mode signal in a specific frequency range, which is transmitted through the differential pair of signal transmission lines 21 and 22, and correspond to the perimeters of the two coupling grooves 1261a and 1263a. That is, the shape and size of the two coupling grooves 1261a and 1263a may determine the perimeters, and determine a part of the noise suppression ability.

Figure 4C:
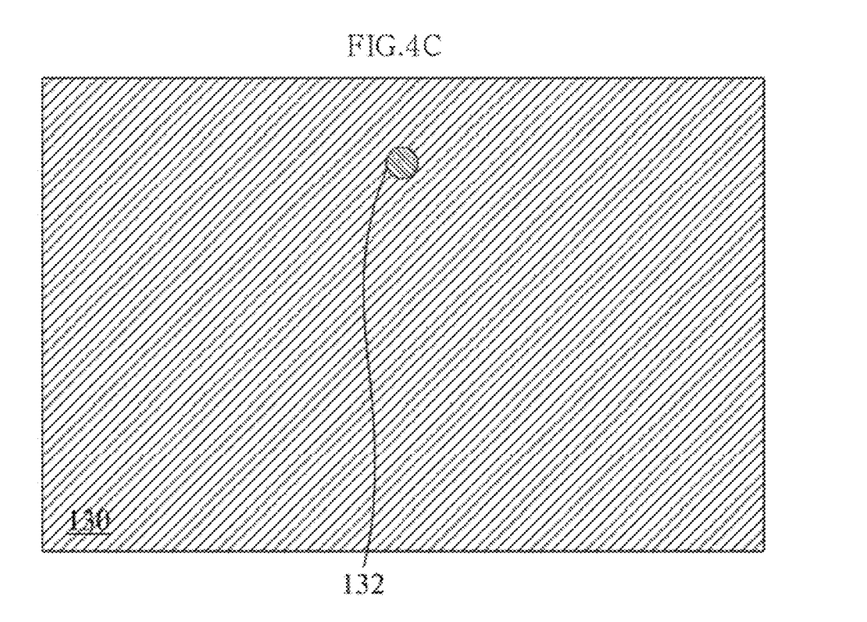
FIG. 4C is a plane view of a third layer of the multilayer substrate in FIG. 2.
Figure 4D:
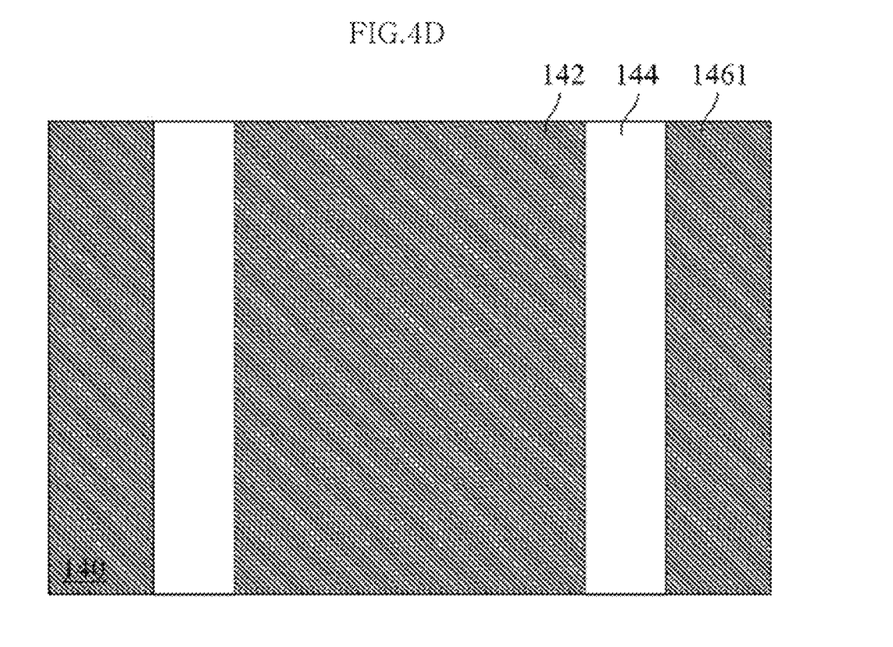
FIG. 4D is a plane view of a fourth layer of the multilayer substrate in FIG. 2.

FIG. 4C illustrates that the conductive connection part 132 is formed in a cylindrical shape. However, other shapes can be applied to the embodiment, and are not limited to the cylindrical shape in FIG. 4C. The main function of the conductive connection part 132 is to electrically connect the conducting wire band 122 and the conductor part 142. That is, the conductive connection part 132 is not limited to the position in FIG. 4C, and can be positioned differently as long as the conductive connection part 132 can electrically connect the conducting wire band 122 and the conductor part 142.

Referring back to FIG. 3, a specific electrical characteristic is formed in a state in which the 3D EMI suppression structure is installed. As the stacked structure is coupled, inductance and capacitance effects are formed by a downward flow of current under the differential pair of signal transmission lines 21 and 22. Furthermore, the structure has an influence on the density of power lines. In an embodiment, when the width of the conducting wire band 122 is larger than the total width occupied by the differential pair of signal transmission lines 21 and 22 adjacent to each other in the first layer 110 of the multilayer substrate and the width of the conductor part 142 is larger than the width of the conducting wire band 122, the power line density can be improved to obtain an excellent suppression effect. The total width may correspond to a value obtained by adding the widths of the differential pair of signal transmission lines 21 and 22 and the distance therebetween.

Figure 5:
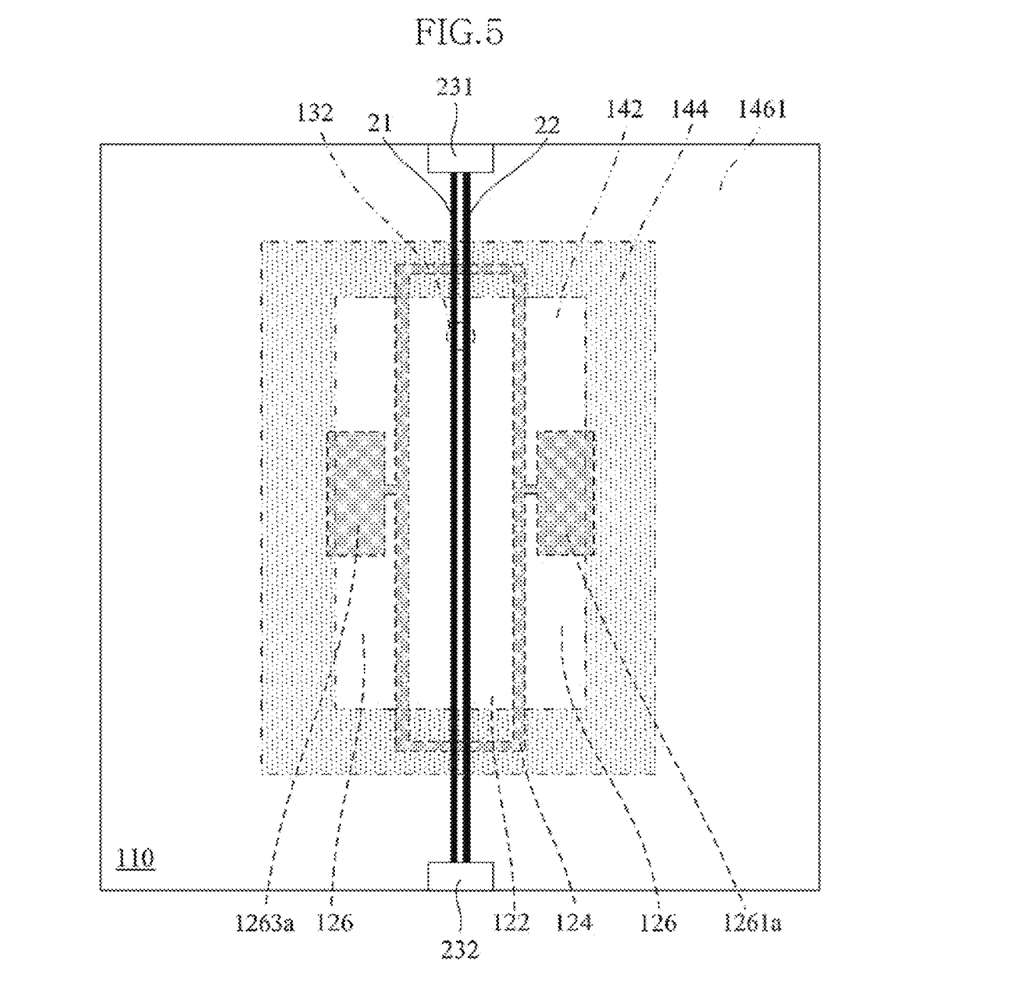
FIG. 5 is a plane view of a 3D EMI suppression structure according to another embodiment.
Figure 6A:
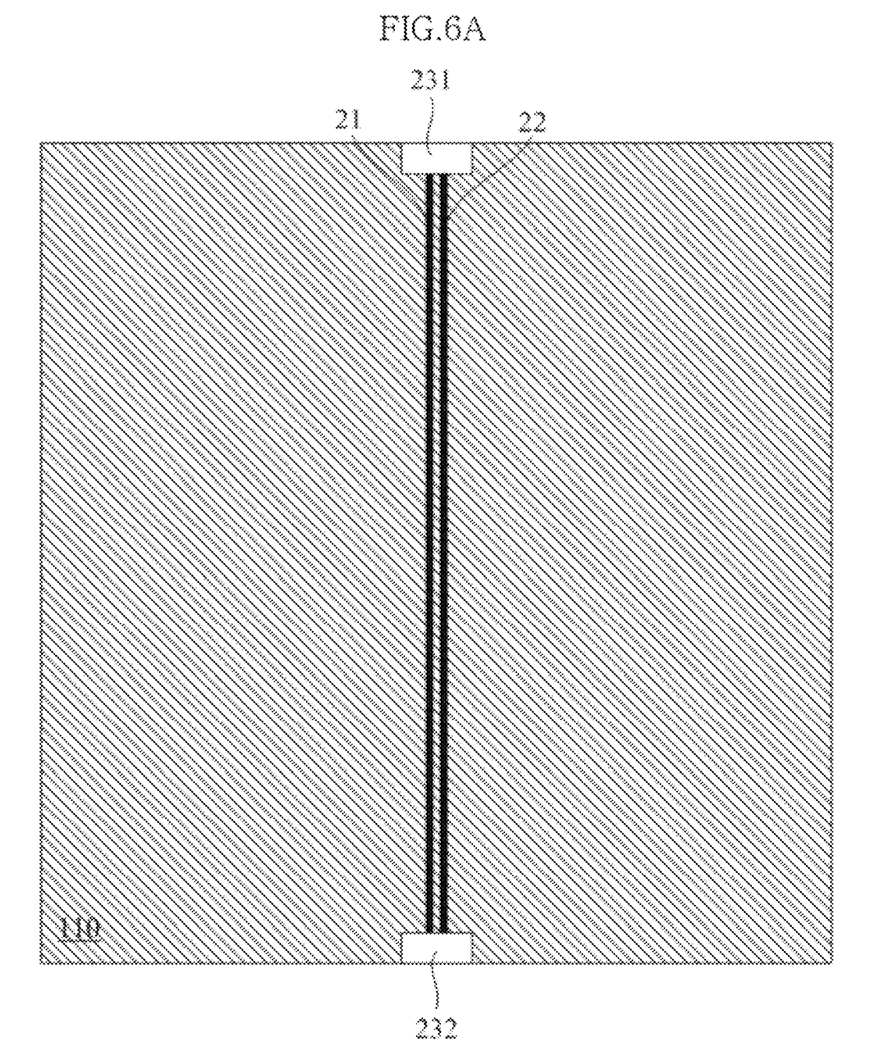
FIG. 6A is a plane view of a first layer of a multilayer substrate in FIG. 5.
Figure 6B:
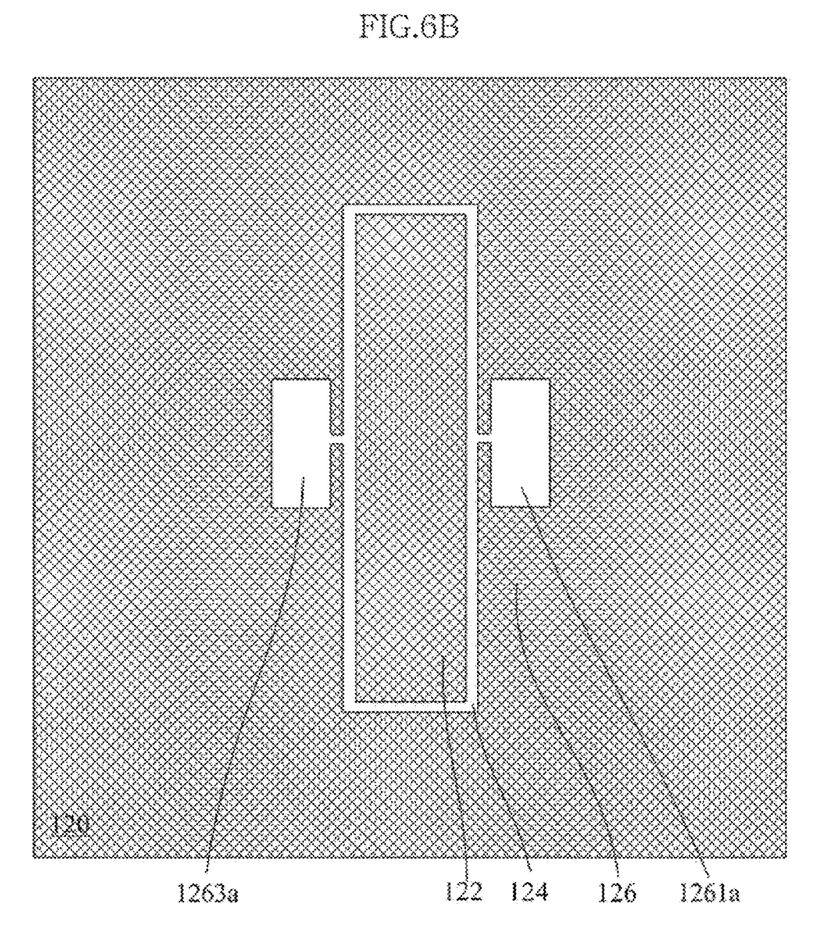
FIG. 6B is a plane view of a second layer of the multilayer substrate in FIG. 5.
Figure 6C:
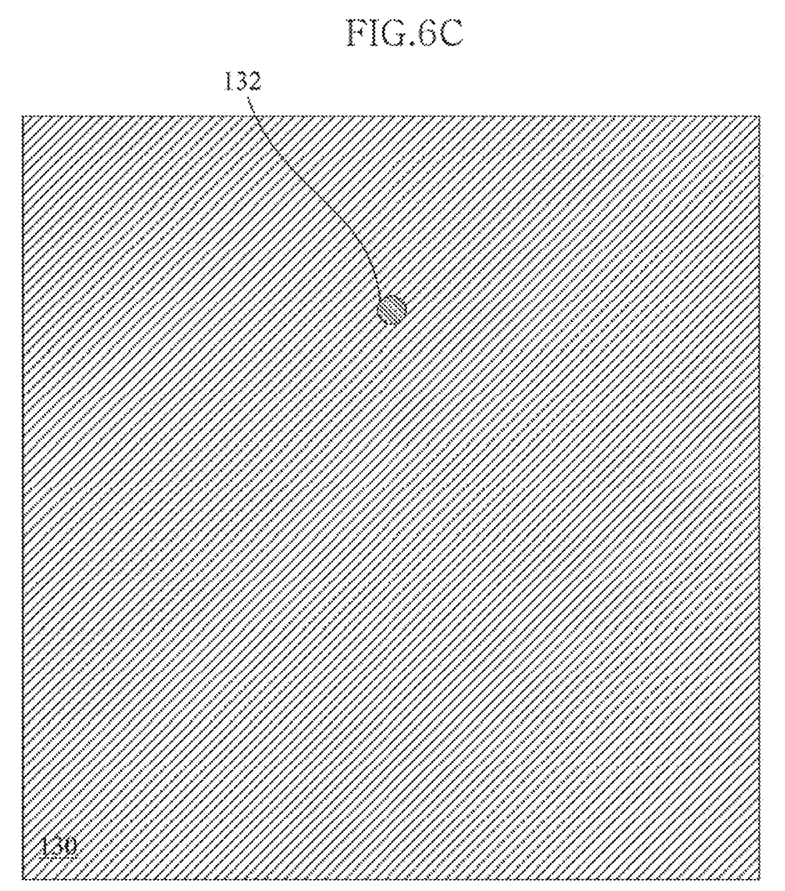
FIG. 6C is a plane view of a third layer of the multilayer substrate in FIG. 5.
Figure 6D:
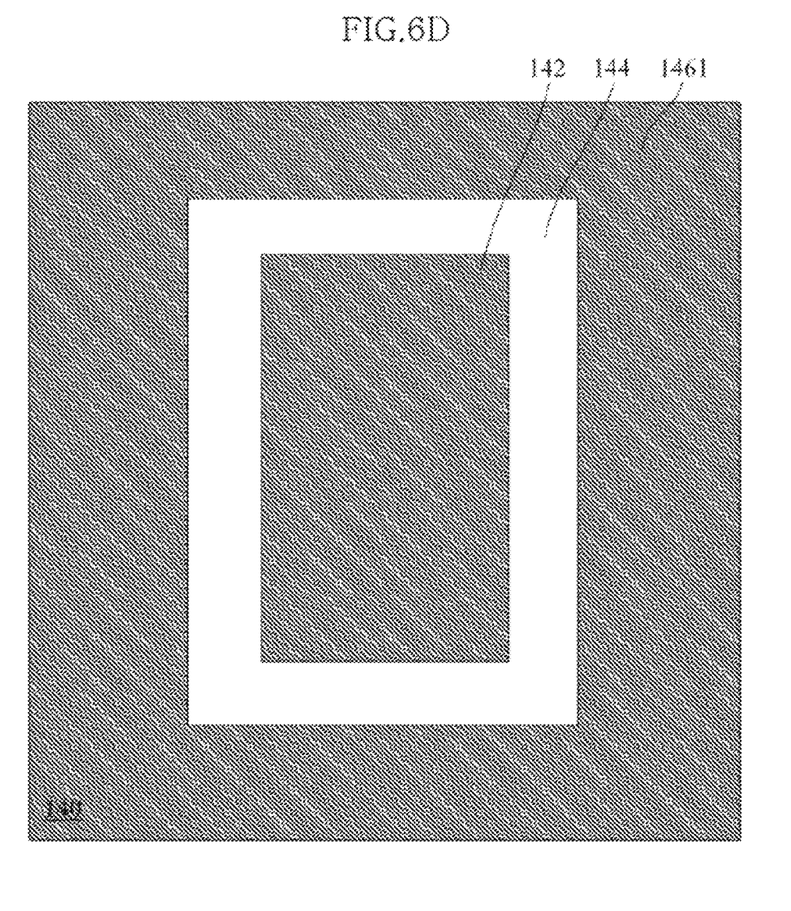
FIG. 6D is a plane view of fourth layer of the multilayer substrate in FIG. 5.

FIG. 5 is a plane view of a 3D EMI suppression structure according to another embodiment. FIGS. 6A to 6D are plane views of first to fourth layers of a multilayer substrate in FIG. 5.

As illustrated in FIGS. 5 and 6A to 6D, the extension direction of the conducting wire band 122 and the conductor part 142 may be parallel to the flow direction of the one or more differential pair of signal transmission lines 21 and 22. The first isolation groove 124 may extend to both ends of the conducting wire band 122 so as to surround the conducting wire band 122, and the second isolation groove 144 may extend to both ends of the conductor part 142 so as to surround the conductor part 142.

In FIG. 5, two signal contacts 231 and 232 which are installed at the first layer 110 of the multilayer substrate and positioned at both ends of the differential pair of signal transmission lines 21 and 22, respectively, use the differential pair of signal transmission lines 21 and 22 as transmission paths. Thus, due to the installation of the 3D EMI suppression structure, the two signal contacts 231 and 232 cannot easily emit EMI to the outside. Such a structure may be applied in the vertical axis direction of a signal line between an external connection port and an internal electronic part of an electronic product, or installed at the top or bottom of an electronic device, in order to obtain the EMI suppression effect. Furthermore, the conducting wire band 122 may be set to have a resistance of 50 ohms.

Figure 7:
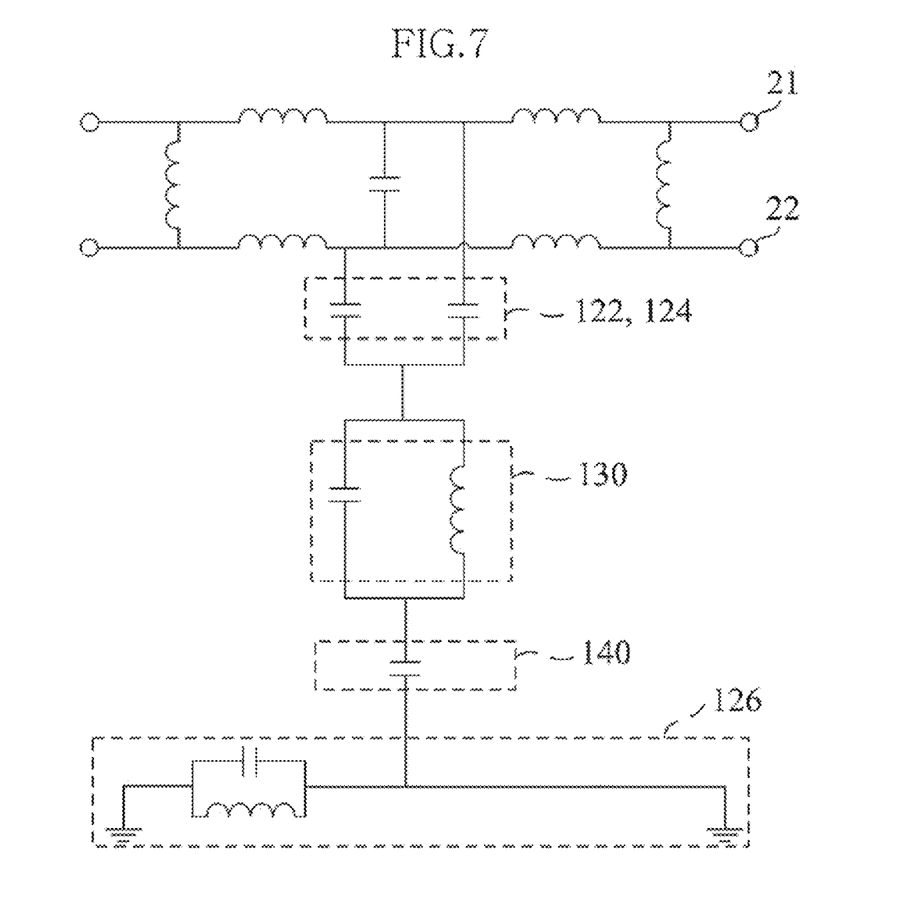
FIG. 7 is an equivalent circuit diagram having a 3D EMI suppression structure according to an embodiment, installed.

FIG. 7 is an equivalent circuit diagram in a state in which the 3D EMI suppression structure according to the embodiment is installed. Between the differential pair of signal transmission lines 21 and 22, inductance and capacitance may be formed due to the mutual inductance and mutual capacitance effect. Furthermore, two parallel capacitance effects may occur in the conducting wire band 122 and the first isolation groove 124, and the isolation layer 130 may form the inductance and capacitance effect during operation of the conductive connection part 132. The resonance layer 140 may provide the capacitance effect, and form the inductance and capacitance effect in the ground part 126. Accordingly, the pattern length of the ground part 126 may have an influence on the inductance and capacitance, thereby providing an excellent EMI suppression effect.

Figure 8:
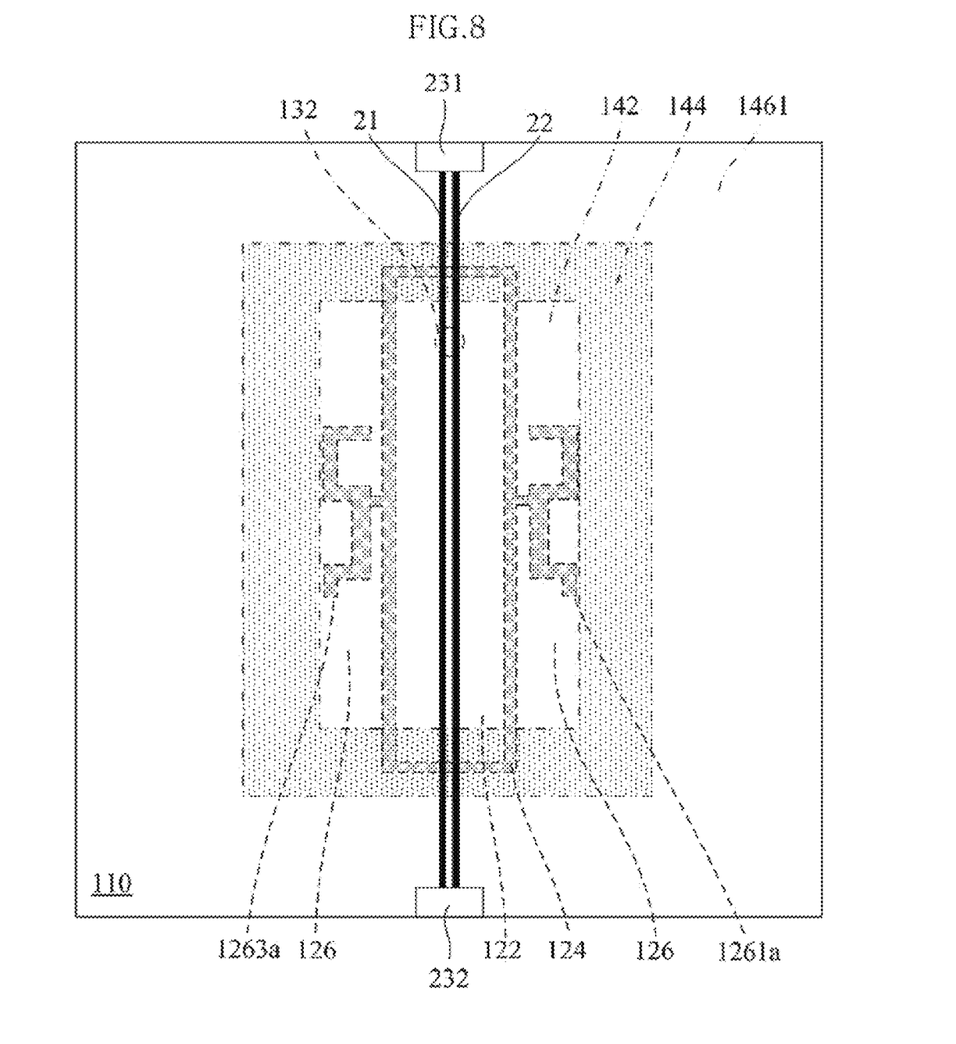
FIG. 8 is a plane view of an EMI suppression structure according to another embodiment.

FIG. 8 is a plane view of an EMI suppression structure according to another embodiment. In the present embodiment, the two coupling grooves 1261a and 1263a are installed in an S-shape in the in-plane direction of the coplanar waveguide structure 120, and have the maximum perimeter within a limited area, thereby obtaining a desirable EMI suppression effect. In addition to the rectangular shape and the S-shape, other various shapes such as a polygonal shape a circular shape and an irregular rod shape can be applied to the embodiment. The irregular rod shape may correspond to a shape obtained by bending and extending the S-shape to have a larger perimeter.

Figure 9:
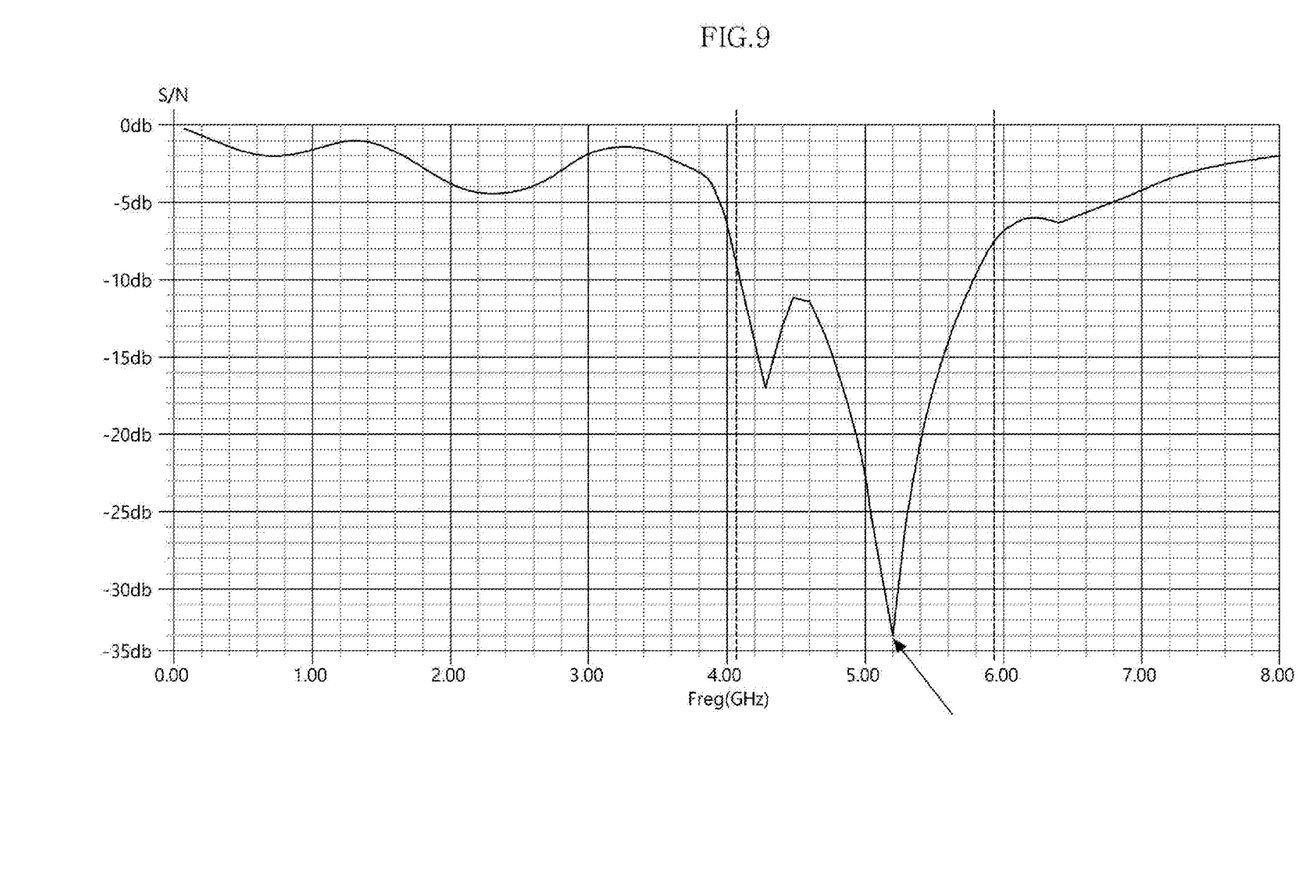
FIG. 9 is a diagram illustrating that noise is suppressed when differential signals are transmitted when the 3D EMI suppression structure according to an embodiment, is installed.

FIG. 9 is a diagram illustrating that noise is suppressed when differential signals are transmitted in a state in which the 3D EMI suppression structure according to the embodiment is installed. As illustrated in FIG. 9, the installation of the 3D EMI suppression structure according to the embodiment can suppress a signal in a frequency range of 5 to 6 GHz (indicated by an arrow) to −10 dB or less, and suppress a signal close to a frequency range of 5 Ghz to −25 dB or less. The above-described frequency band is designed for a notebook computer which uses a transmission frequency band around 6 GHz, for example. Thus, the installation of the 3D EMI suppression structure according to the embodiment can effectively suppress common mode noise which may be generated by an internal line of the notebook computer. Thus, wireless transmission in the frequency band of 6 GHz is not disturbed.

Figure 10:
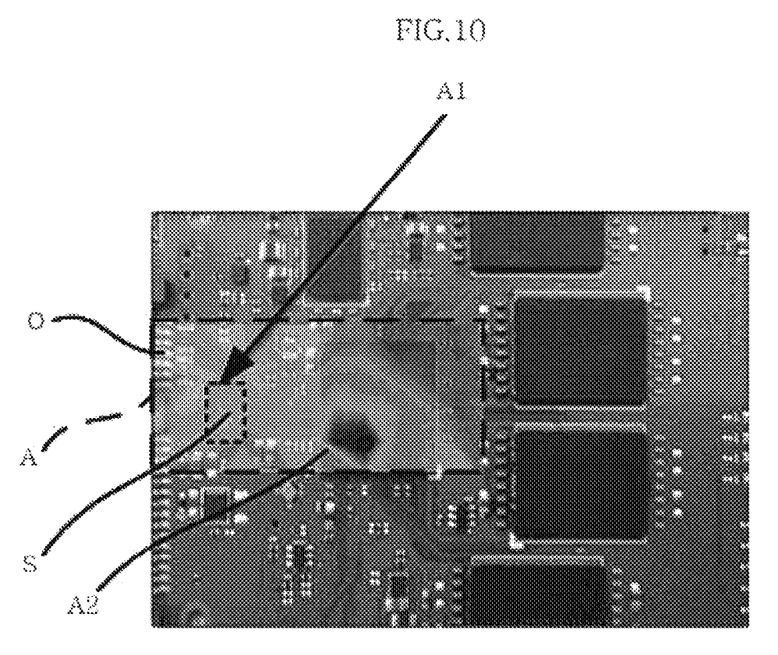
FIG. 10 is a spectrogram of wireless signals which are emitted when a solid state disk (SSD) is operated when the 3D EMI suppression structure according to an embodiment, is installed.

FIG. 10 is a spectrogram of wireless signals which are emitted when a solid state disk (SSD) is operated in a state in which the 3D EMI suppression structure according to the embodiment is installed. In FIG. 10, a region A may indicate a wireless signal spectrogram when the SSD is operated, and include a control chip and a signal output terminal O. The control chip is indicated by A2, and a black region at the right side of the control chip A2 corresponds to a flash-integrated module. The spectrogram generated at the position of the control chip A2 indicates that the chip emits a large amount of electromagnetic waves while being operated at high speed. In this case, an interference signal is often transmitted to the signal output terminal O along the differential pair of signal lines S (region A1). Then, the interference signal is emitted from the signal output terminal O which causes interference outside. However, after the 3D EMI interference suppression structure according to the embodiment is installed under the differential pair of signal lines S, the frequency spectrum density of electromagnetic waves at the signal output terminal O is lower than the frequency spectrum density of electromagnetic waves at the position of the control chip A2.

As a result, the coplanar waveguide structure 120, the isolation layer 130, and the resonance layer 140 (all shown in FIG. 3) may be combined to provide an excellent EMI suppression effect, thereby contributing to improving the signal transmission quality.

According to the embodiment, as the resonance layer is installed under the coplanar waveguide structure, the 3D EMI suppression structure can further suppress common mode interference generated by a differential pair of signal transmission lines. Based on such a structure, the ground concave-groove structure does not need to cross the region under the differential pair of signal transmission lines. Therefore, since EMI is not caused for the differential pair of signal transmission lines, the 3D EMI suppression structure can provide an excellent EMI suppression effect.

The ground concave-groove structure which is symmetrically installed in the second layer of the multilayer substrate at both sides of the differential pair of signal transmission lines may form the coplanar waveguide structure with the differential pair of signal transmission lines. Based on such a structure, the 3D EMI suppression structure may be installed under the transmission lines between a signal output terminal of an electronic device and a signal output terminal of an internal assembly of the electronic device. Then, the 3D EMI suppression structure can provide an excellent EMI suppression effect such that the signal transmission quality is not affected.

While certain embodiments have been described above, it will be understood to those skilled in the art that the embodiments described are by way of example only. Accordingly, the electronic device described herein should not be limited based on the described embodiments. Rather, the electronic device described herein should only be limited in light of the claims that follow when taken in conjunct on with the above description and accompanying drawings.

What is claimed is:

1. A 3D Electromagnetic Interference (EMI) suppression structure which is installed in a multilayer substrate and stacked in the vertical axis direction of one or more differential pairs of signal transmission lines installed at a first layer of the multilayer substrate, the 3D EMI suppression structure comprising:
   a coplanar waveguide structure installed at a second layer of the multilayer substrate, and comprising a conducting wire band, two ground parts positioned at both sides of the conducting wire band and isolated from the conducting wire band by a distance corresponding to a first isolation groove, and a coupling groove positioned in each of the ground parts and connected to the first isolation groove adjacent thereto through an extended groove;
   an isolation layer installed at a third layer of the multilayer substrate and having a conductive connection part connected to the conducting wire band through the isolation layer; and
   a resonance layer installed at a fourth layer of the multilayer substrate, and comprising a conductor part and two ground conductor parts which are positioned at both sides of the conductor part and isolated from the conductor part by a distance corresponding to a second isolation groove,
   wherein the conductor part is connected to the conductive connection part of the isolation layer.

2. The 3D EMI suppression structure according to claim 1, wherein the two coupling grooves installed at the second layer of the multilayer substrate are symmetrical with respect to the conducting wire band.

3. The 3D EMI suppression structure according to claim 2, wherein the coupling groove has a rectangular shape, a polygonal shape, or an S-shape in the in-plane direction of the coplanar waveguide structure.

4. The 3D EMI suppression structure according to claim 1, wherein an extension direction of the conducting wire band and the conductor part is parallel to a flow direction of the one or more differential pairs of signal transmission lines, the first isolation groove is extended to both ends of the conducting wire band and surrounds the conducting wire band, and the second isolation groove is extended to both ends of the conductor part and surrounds the conductor part.

5. The 3D EMI suppression structure according to claim 4, wherein a width of the conducting wire band is larger than a total width occupied by the one or more differential pairs of signal transmission lines adjacent to each other at the first layer of the multilayer structure.

6. The 3D EMI suppression structure according to claim 5, wherein a width of the conductor part is larger than the width of the conducting wire band.

7. The 3D EMI suppression structure according to claim 6, wherein a perimeter of the coupling groove corresponds to a common mode signal which is to be suppressed, and the common mode signal is passed through the one or more differential pairs of signal transmission lines, and has a specific frequency range.

8. An electronic device, comprising:
   a multilayer substrate;
   two signal contacts installed at a first layer of the multilayer substrate;
   a differential pair of signal transmission lines installed at the first layer of the multilayer substrate, and comprising first and second signal lines connected between the signal contacts as a transmission path between the two signal contacts; and
   a 3D Electromagnetic Interference (EMI) suppression structure installed in the multilayer substrate under the differential pair of transmission lines and comprising:
   a coplanar waveguide structure installed at a second layer of the multilayer substrate, and comprising a conducting wire band, two ground parts positioned at both sides of the conducting wire band and isolated from the conducting wire band by a distance corresponding to a first isolation groove, and a coupling groove positioned in each of the ground parts and connected to the first isolation groove adjacent thereto through an extended groove;
   an isolation layer installed at a third layer of the multilayer substrate and having a conductive connection part connected to the conducting wire band through the isolation layer; and
   a resonance layer installed at a fourth layer of the multilayer substrate, and comprising a conductor part and two ground conductor parts which are positioned at both sides of the conductor part and isolated from the conductor part by a distance corresponding to a second isolation groove, the conductor part being connected to the conductive connection part of the isolation layer.

9. The electronic device according to claim 8, wherein an extension direction of the conducting wire band and the conductor part is parallel to a flow direction of the differential pair of signal transmission lines, the first isolation groove is extended to both ends of the conducting wire band so as to surround the conducting wire band, and the second isolation groove is extended to both ends of the conductor part so as to surround the conductor part.

10. The electronic device according to claim 9, wherein the two coupling grooves installed at the second layer of the multilayer substrate are symmetrical with respect to the conducting wire band.

* * * * *